United States Patent [19]

Tateno

[11] Patent Number: 4,758,820
[45] Date of Patent: Jul. 19, 1988

[54] SEMICONDUCTOR CIRCUIT
[75] Inventor: Tetsuya Tateno, Atsugi, Japan
[73] Assignee: Canon Kabushiki Kaisha, Tokyo, Japan
[21] Appl. No.: 27,049
[22] Filed: Mar. 23, 1987

Related U.S. Application Data

[63] Continuation of Ser. No. 833,046, Feb. 26, 1986, abandoned.

[30] Foreign Application Priority Data

Feb. 28, 1985 [JP] Japan .................................. 60-37383

[51] Int. Cl.⁴ .............................................. H03M 1/78
[52] U.S. Cl. ............................................ 340/347 DA
[58] Field of Search ................................. 340/347 DA

[56] References Cited

U.S. PATENT DOCUMENTS 3,258,765 6/1966 Battjes ......................... 340/347 DA
4,458,201 7/1984 Koen ............................ 340/347 DA Primary Examiner—Charles D. Miller
Attorney, Agent, or Firm—Fitzpatrick, Cella, Harper and Scinto

[57] ABSTRACT

A semiconductor circuit is provided with a constant current circuit, a resistor network to which a current from the constant current circuit is supplied, and a device between the constant current circuit and the resistor network for switching the current supplied from the constant current circuit to the resistor network.

1 Claim, 3 Drawing Sheets

SEMICONDUCTOR CIRCUIT

This application is a continuation of application Ser. No. 833,046, filed Feb. 26, 1986, now abandoned.

BACKGROUND OF THE INVENTION

1. Field of the Invention

This invention relates to a semiconductor circuit.

2. Related Background Art

For example, a current switch in a semiconductor integrated circuit is often used in A/D and D/A converters now existing as the interface between the analog and the digital signals. One of A/D and D/A converters is comprised of a constant current circuit and a resistor circuit, and the current switch is used for switching the current of the constant current circuit relative to said resistor circuit.

Operation of the current switch will hereinafter be described on the basis of the conventional circuit of FIG. 1 of the accompanying drawings. Referring to FIG. 1, reference numerals 11–14 designate lateral PNP type transistors (hereinafter referred to as L-PNP) for a constant current. Reference numerals 7–10 denote resistors for determining the value of the current, and reference numerals 15–21 designate ladder type resistor networks. Reference numerals 22–25 denote NPN transistors which provide current switches and which effect the switching operation by a voltage being supplied to the base inputs thereof corresponding to each bit of a digital value. The base-emitter voltage of L-PNP 11–14 is controlled by the switching operation to discretely vary the currents flowing into the resistor networks. As a result, an analog voltage corresponding to the digital value is obtained at a terminal 4.

However, this circuit has the following disadvantages:

(1) Power consumption is increased by the switching operation. The base-emitter voltage $V_{BE}$ of L-PNP 11–14 becomes extinct due to the switching of the NPN transistors 22–25 and therefore, a current of $V_{BE}/R8$ increases.

(2) A large current flows into the bias line 5 of L-PNP 11–14 and therefore, the current driving capability of the bias circuit 1 must be made great.

(3) Since the current flowing through the bias line 5 of L-PNP 11–14 is great, the influence of the voltage drop in the bias line cannot be neglected.

(4) Since the current flowing into the ground line 3 varies, the amount of voltage drop in the ground line varies, and this leads to the undesirable possibility that the ground line level fluctuates.

SUMMARY OF THE INVENTION

It is an object of the present invention to overcome the above-noted disadvantages and to provide a semiconductor circuit suitable for integration.

It is another object of the present invention to provide a semiconductor circuit provided with a constant current circuit, a resistor network to which a current from the constant current circuit is supplied, and means between the constant current circuit and the resistor network for switching the current supplied from the constant current circuit to the resistor network.

DESCRIPTION OF THE PREFERRED EMBODIMENT

Figure 1:
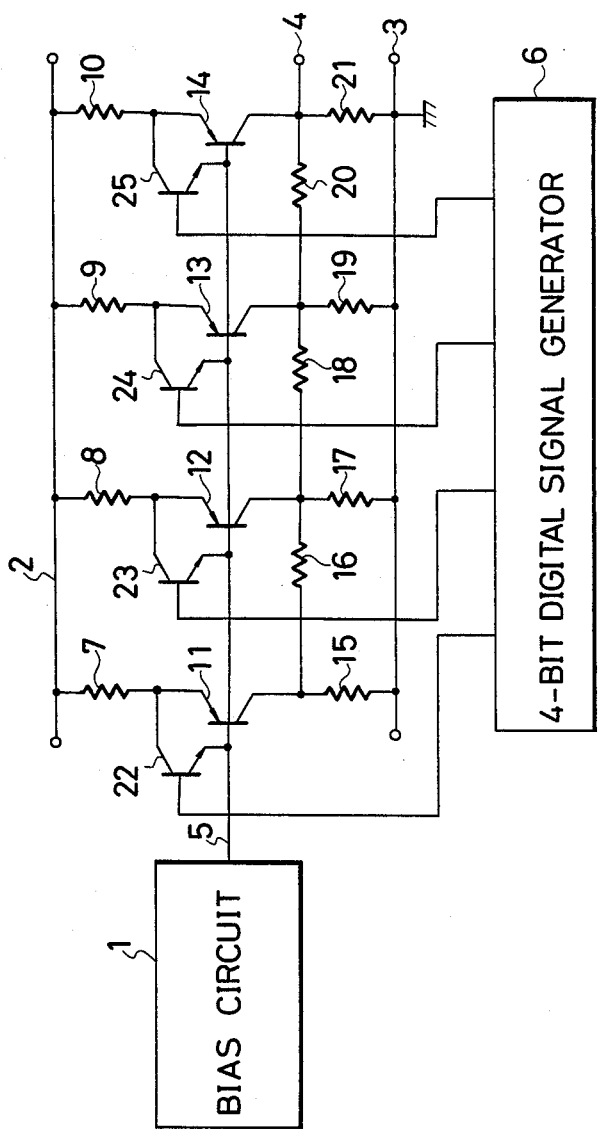
FIG. 1 is a circuit diagram showing an example of a D/A converter in which the conventional current switch is used.
Figure 2:
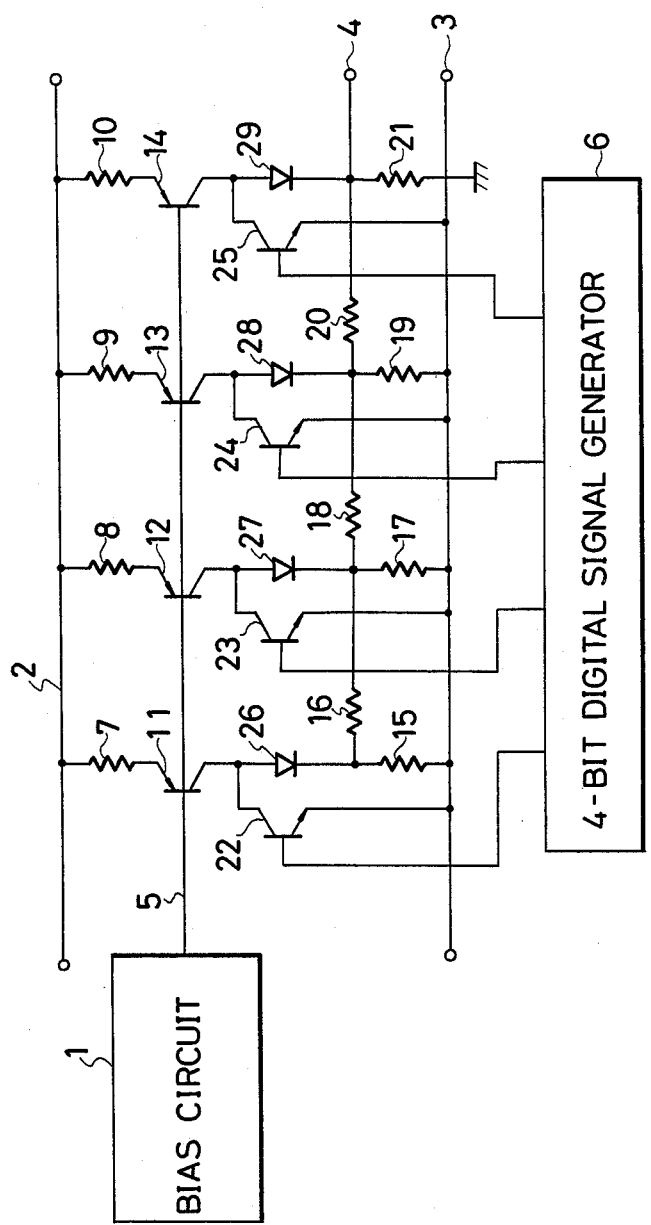
FIG. 2 is a circuit diagram showing an example of a D/A converter using a current switch according to the present invention.

FIG. 2 shows an embodiment of the present invention. Referring to FIG. 2, reference numeral 1 designates a bias circuit, reference numeral 2 denotes a power source, reference numeral 3 designates a ground, reference numeral 4 denotes an analog signal output terminal, reference numeral 5 designates a bias line, reference numeral 6 denotes a 4-bit digital signal generator, reference numerals 7–10 designate resistors for a constant current, reference numerals 11–14 denote L-PNP Tr(transistors) for a constant current having their bases connected to one another, reference numerals 15–21 designate a ladder resistor network, reference numerals 22–25 denote NPN Tr for a current switch, and reference numerals 26–29 designates diodes for a current switch.

L-PNP Tr 11–14, together with the bias voltage of the bias circuit 1 and the resistors 7–10, constitute a constant current circuit which supplies a constant current to the resistor network 15–21. NPN Tr 22–25 effect the switching operation by a digital signal being input to their bases from the digital signal generator 6, and cause the constant current to flow selectively into the resistor network 15–21 and the ground line 3 through the diodes 26–29. The diodes 26–29 prevent the inflow of the current from the ground line 3 into the resistor network 15–21.

The resistor network 15–21 forms an R-2R type ladder resistor, and an analog voltage corresponding to a digital value is obtained at the output terminal 4 as is well known.

According to the construction as described above, the current flowing through the bias line 5 is only a current corresponding to the whole constant current divided by the current amplification rate of L-PNP Tr 11–14 and thus, the current driving capability of the bias circuit 5 may be small.

Also, since the current flowing through the bias line 5 is small, the voltage drop in the bias line 5 is small and the accuracy of D/A conversion is improved.

Further, all the constant current always flows into the ground line 3 and therefore, the potential of the ground line 3 is not varied by the digital value and the accuracy of A/D conversion is improved.

Figure 3:
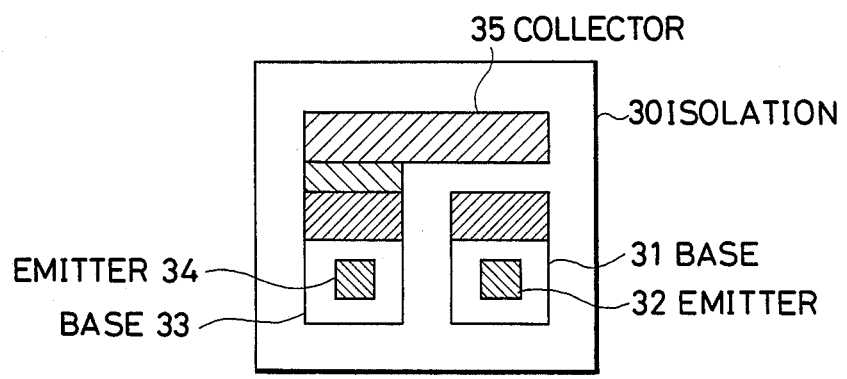
FIG. 3 shows an example of the configuration of the present invention when integrated.

Furthermore, the collectors of NPN Tr 22–25 and the bases of the diodes 26–29 are connected together at each bit and therefore, where they are integrated, they can be formed in the same isolation area, as shown in FIG. 3. Accordingly, the degree of integration is improved. In FIG. 3, reference numeral 30 designates an isolation area, reference numeral 31 denotes the base area of a switching transistor, reference numeral 32 designates the emitter area of the transistor, reference numeral 35 denotes the collector area of the transistor, reference numeral 33 designates the base area of the diode, and reference numeral 34 denotes the emitter area of the diode. The base area 33 of the diode and the collector area 35 are connected together by metal wiring.

Although the circuit of the present embodiment is a 4-bit D/A converter, the present invention can of course be applied to D/A converters different in bit number. Further, it is a matter of course that the present invention can also be applied to an A/D converter of the successive comparison type or the like which is a construction having a feedback loop incorporated into a D/A converter.

According to the present invention, as described above, there can be provided a semiconductor circuit which operates very stably and highly accurately and which only requires low power consumption and is suitable for integration.

I claim:

1. A semiconductor circuit comprising:
   a plurality of resistors each comprising first and second terminals, wherein said first terminals are commonly connected to a power source line;
   a plurality of first transistors, each comprising first and second main electrodes and a control electrode, wherein each first main electrode is associated with a corresponding one of said plurality of resistors and is connected to said second terminal of its corresponding resistor, and wherein said control electrodes of said plurality of first transistors are commonly connected to a bias line;
   a plurality of second transistors connected to said second main electrodes of said plurality of first transistors and each comprising a main electrode and a control electrode;
   a plurality of diodes connected to said second main electrodes of said plurality of first transistors parallel to said plurality of second transistors;
   a resistor network connected to said main electrode of each of said plurality of second transistors and each of said plurality of diodes; and
   a digital signal generator connected to said control electrode of each of said plurality of second transistors.

* * * * *